United States Patent [19]

Komatsu et al.

[11] Patent Number: 4,743,750
[45] Date of Patent: May 10, 1988

[54] PROCESS FOR FORMING PHOTOSENSOR FROM SI(X) PRECURSOR AND ACTIVATED HYDROGEN

[75] Inventors: Toshiyuki Komatsu, Yamato; Masaki Fukaya, Yokohama; Satoshi Itabashi, Atsugi, all of Japan

[73] Assignee: Canon Kabushiki Kaisha, Tokyo, Japan

[21] Appl. No.: 849,877

[22] Filed: Apr. 9, 1986

[30] Foreign Application Priority Data

Apr. 16, 1985 [JP] Japan .................. 60-80862

[51] Int. Cl.$^4$ ............................. H01J 40/14
[52] U.S. Cl. .................. 250/211 R; 430/84; 430/65
[58] Field of Search ........... 250/211 R; 357/59 C, 357/30 K, 63, 64, 2; 430/84, 95, 64, 65, 57; 427/74

[56] References Cited

U.S. PATENT DOCUMENTS

| | | | |
|---|---|---|---|
| 4,307,372 | 12/1981 | Matsui et al. | 250/211 R |
| 4,361,638 | 11/1982 | Higashi et al. | 427/74 |
| 4,365,015 | 12/1982 | Kitajima et al. | 430/84 |
| 4,394,426 | 7/1983 | Shimizu et al. | 430/65 |
| 4,439,463 | 3/1984 | Miller | 427/39 |
| 4,450,185 | 5/1984 | Shimizu et al. | 427/39 |
| 4,532,199 | 7/1985 | Ueno, et al. | 430/128 |
| 4,546,243 | 10/1985 | Hamano et al. | 250/211 R |
| 4,592,983 | 6/1986 | Saitoh et al. | 430/57 |
| 4,600,801 | 7/1986 | Guha et al. | 357/30 K |
| 4,634,648 | 1/1987 | Jansen et al. | 430/95 |
| 4,664,937 | 5/1987 | Ovshinsky, et al. | 427/39 |

*Primary Examiner*—David C. Nelms
*Assistant Examiner*—William L. Oen
*Attorney, Agent, or Firm*—Fitzpatrick, Cella, Harper & Scinto

[57] ABSTRACT

A photosensor having a substrate, a photoconductive layer formed on the substrate and containing amorphous silicon, a pair of electrodes electrically connected to the photoconductive layer and a light receiving section having a predetermined area for applying light to the photoconductive layer, wherein the photoconductive layer is formed by producing a precursor (SiX) including at least silicon atoms and halogen atoms and an active seed (H) including hydrogen atoms, at the region outside of a layer forming spatial region where the photoconductive layer is formed, and by introducing the precursor and the active seed into the layer forming spatial region to deposit amorphous silicon on the surface of the substrate.

4 Claims, 7 Drawing Sheets 25 27 23 26 29

PROCESS FOR FORMING PHOTOSENSOR FROM SI(X) PRECURSOR AND ACTIVATED HYDROGEN

BACKGROUND OF THE INVENTION

1. Field of the Invention

The present invention relates to a photosensor constituting a photoelectric conversion device used at a light input section of an image information processing apparatus, such as computers, facsimiles, digital copying machines or character readers.

2. Related Background Art

As an element of a photoelectric conversion device used at a light input section of an image information processing apparatus, such as computers, facsimiles, digital copying machines or character readers, a photosensor has been widely used in the art. Recently, a high-sensitivity image reader has been developed which is constructed of an elongated line sensor having photosensors disposed in an array. As examples of a photosensor constituting such an elongated line sensor, there are known a planer type photoconductive photosensor and a so-called sandwich type photoconductive photosensor. Such a photosensor has a photoconductive layer including amorphous silicon (hereinafter abbreviated as A-Si (Hi, X)) containing hydrogen atoms (H) and halogen atoms (X) as a photoconductive substance. In a planer type photoconductive photosensor a pair of electrodes made of such materials as metal are disposed on the photoconductive layer in such a way that a light reception area is formed at a gap between the electrodes. In a so-called sandwich type photoconductive photosensor, the photoconductive layer is sandwiched between a pair of electrodes.

In forming an A-Si (Hi,X) film, various methods have been used, such as a vacuum evaporation method, plasma CVD method, DVD method, reactive sputtering method, ion-plating method, photo-CVD method. Generally, the plasma CVD method among those methods has been widely used in practice.

A photoconductive film made by depositing an A-Si (Hi,X), however has room for further improving the total characteristics including electrical and optical characteristics, fatigue characteristic under repetitive operation, environmental characteristic as well as uniform quality characteristic.

For instance, the reaction process of forming an A-Si (Hi,X) deposition film by a common plasma CVD method is considerably complicated as compared with a conventional CVD method, and closely associated with uncertain reaction mechanisms. Furthermore, in forming a deposition film, many parameters must be taken into consideration, such as substrate temperature, flow and ratio of introduced gases, pressure, high frequency power, electrode structure, reaction room structure, exhaust rate, generation method of plasma, and the like. A proper combination must be selected among the various parameters, and in some cases the plasma becomes unstable and adversely effects the deposition film. In addition, it is necessary to select particular parameters for each apparatus, thus resulting in a difficulty in generalizing the manufacturing conditions.

In spite of such circumstances, the plasma CVD method is presently considered as a most suitable one for forming an A-Si (Hi,X) film which fully meets the requirements of electrical and optical characteristics in various applications.

However, depending on application and usage of a deposition film, it sometimes becomes necessary to conduct mass production with good reproducibility, while fully meeting the requirements of large scale, film thickness uniformity, and film quality uniformity. In such a case, if the conventional plasma CVD method is used for forming an A-Si (H,X) deposition film, the cost of a mass-production apparatus becomes considerably high, and complicated and severe control for mass production as well as fine adjustment of the apparatus becomes necessary. These have been pointed out as the problems to be solved.

Apart from the above problems, a high temperature is required in the prior art using the CVD method, thus making it difficult to obtain a practically available deposition film.

As seen from the foregoing, it has long been desired to develop an A-Si (H,X) film forming method which can conduct mass production inexpensively while retaining practically usable quality and uniformity.

A planer type photoconductive photosensor having a photoconductive layer made of an A-Si(H,X), (hereinafter referred to as A-Si(H,X) photosensor), can produce photocurrent 10 to 100 times as large as that of a photodiode type photosensor. However, there is room for further improvement on (i) light response time and (ii) photocurrent reduction upon application of light.

In addition, since the A-Si(H,X) photosensor utilizes secondary photocurrent (this is the reason why the photosensor can produce large photocurrent as described above), the amount of photocurrent varies with direct relation to the life time of photo-carrier (electron) in the photoconductive layer made of A-Si (H,X),(hereinafter referred to as A-Si(H,X) layer). Therefore, to ensure uniformity of a linear A-Si(H,X) photosensor array made of plural bits disposed in an array, uniformity of electrical characteristics is required for the A-Si(H,X) layer. Such an A-Si(H,X) layer, if manufactured by the conventional plasma CvD method, causes a problem regarding manufacturing yield.

SUMMARY OF THE INVENTION

An object of the present invention is to solve the problems regarding performance of an A-Si(H,X) photosensor manufactured by a plasma CVD method and manufacturing problems, and provide an A-Si(H,X) photosensor having high productivity, sensitivity, uniformity and stability.

Another object of the present invention is to provide a photosensor having a substrate, a photoconductive layer formed on said substrate and containing amorphous silicon, a pair of electrodes electrically connected to said photoconductive layer and a light receiving section having a predetermined area for applying light to said photoconductive layer, wherein said photoconductive layer is formed by producing a precursor (SiX) including at least silicon atoms and halogen atoms and an active seed (H) including hydrogen atoms, at the region outside of a layer forming spatial region where said photoconductive layer is formed, and by introducing said precursor and said active seed into said layer forming spatial region to deposit amorphous silicon on the surface of said substrate.

DETAILED DESCRIPTION OF THE PREFERRED EMBODIMENTS

Figure 1:
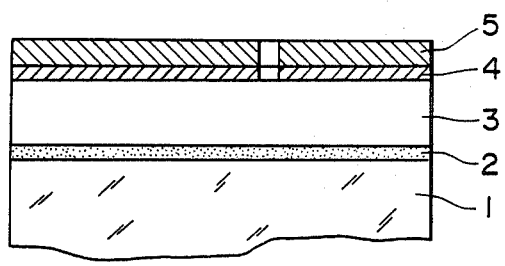
FIG. 1 is a schematic cross-section showing the structure of a photosensor according to the present invention.

In FIG. 1, a schematic cross-section of an example of the photosensor according to the present invention is shown.

On a substrate 1, a photoconductive layer 3 made of A-Si(H,X) is formed, and a pair of electrodes 5 are formed on the photoconductive layer 3 with a constant gap therebetween. Between the pair of electrodes 5 and the photoconductive layer 3, usually an ohmic contact layer 4 made of n+ A-Si(H,X) is formed for obtaining ohmic contact therebetween. An intermediate layer 2 may be formed between the substrate 1 and the photoconductive layer 3 for improvement of interlayer tight contact and for prevention of influence of the substrate (interfacial level, contamination, etc.). The intermediate layer 2 is made of such as an A-Si(H,X) layer of relatively high insulation, SiNH layer or $SiO_2$.

Figure 2:
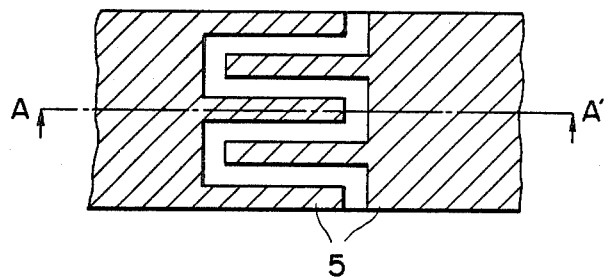
FIG. 2 is a schematic plan view of FIG. 2.

FIG. 2 is a schematic plan view of the photosensor shown in FIG. 1, wherein the electrodes 5 are formed of a comb shape to reduce the resistance of the light reception area of the photosensor and increase an output current.

According to the present invention, the photoconductive layer constituting the photosensor is formed by producing a precursor (SiX) including at least silicon atoms and halogen atoms and an active seed (H) including hydrogen atoms, at the region outside of a layer forming spatial region where said photoconductive layer is formed, and by introducing said precursor and said active seed into said layer forming spatial region to deposit amorphous silicon on the surface of said substrate.

It is preferable to form the intermediate layer and the ohmic contact layer in a similar manner as in the photoconductive layer. In such a case, a similar to the precursor (SiX) and the active seed (H), raw substances necessary for forming the respective layers are respectively introduced into the layer forming spatial region in the form of gas.

The "precursor" is intended here to mean that it can serve as a raw substance of a deposition film to be formed, but at its own energy level the precursor by itself cannot react at all or, even if it can, it reacts only a little. The "active seed" is intended here to mean that it has a function of activating the precursor to enable a formation of a deposition film by performing a chemical interaction between the precursor, for example, by giving energy to the precursor or by reacting with the precursor. Therefore, the active seed may include substance constituting a deposition film to be formed or may not include such substance.

According to the present invention, the life time of the precursor, which is introduced into a film forming spatial region (layer forming spatial region) (A) from a precursor producing spatial region (B), is preferably 0.01 sec or more, more preferably 0.1 sec or more, most preferably 1 sec or more. The life time is selected as desired. The elements constituting the precursor constitute a main component of the deposition film to be formed in the film forming spatial region (A). The life time of the active seed, which is introduced from an active seed producing spatial region (C), is preferably 10 sec or less, more preferably 8 sec or less, most preferably 5 sec or less. When a deposition film is formed in the film forming spatial region (A), the active seed is concurrently introduced into the film forming spatial region (A) from the active seed producing spatial region (C) and chemically interacts with the precursor including elements constituting the main component of a deposition film to be formed. Thus, a deposition film having a desired photoconductive characteristic is readily formed on a desired substrate.

According to the present invention, plasma is not used in the film forming spatial region (layer forming spatial region) (A) as described above where a deposition film constituting a photoconductive layer having desired characteristics is formed, so that the main parameters among those parameters determining the characteristics of a deposition film to be formed are limited only to the quantities of the precursor (SiX) and the active seed (H) to be introduced, temperature of the substrate, atmospheric temperature and internal pressure at the film forming spatial region (A). Therefore, formation of a deposition film is easily controlled, thereby enabling mass production with good reproducibility.

Furthermore, a deposition film formed without generation of plasma in the film forming spatial region (A) is not substantially subjected to the influences of, such as etching process or abnormal discharge phenomenon. In addition, according to the present invention, by controlling atmospheric temperature in the film forming spatial region (A) and the temperature of the substrate as desired, a more stable CVD method is available.

One of the remarkably different points from the conventional technique is that an active seed activated beforehand at a different spatial region from the film forming spatial region (A) is used. Therefore, a rate of deposition is extraordinarily improved as compared with that of a conventional CVD method, and also the temperature of the substrate can be lowered while forming a deposition film. Thus, a deposition film having a stable quality can be mass-produced at a low cost.

The active seed to be produced in the active seed producing spatial region according to the present invention may be excited with discharge, light, heat or the like energy or with a combination thereof, or may be produced by means of contact with or addition of such as catalyst.

As a raw substance to be introduced in the precursor producing spatial region (B) according to the present invention, those substances consisting of silicon atoms bonded with electron attractive atoms, atom group or polar group may be used, such as $SiX_{2n+2}$ (n=1, 2, 3, ..., X=F, Cl, Br, I), $(SiX_2)_m$ (m≧3, X=F, Cl, Br, I), $SiHX_{2n+1}$ (n=1, 2, 3, ..., X=F, Cl, Br, I), $SiH_2X_{2n}$ (n=1, 2, 3, ..., X=F, Cl, Br, I).

Particularly, $SiF_4$, $(SiF_2)_5$, $(SiF_2)_6$, $(SiF_2)_4$, $Si_2F_5$, $SiHF_3$, $SiH_2F_2$, $SiCl_4$, $(SiCl_2)_5$, $SiBr_4$, $(SiBr_2)_5$ may be used which are gaseous or are readily gasified.

$SiH_2(C_6H_5)_2$ and $SiH_2(CN)_2$ may also be used depending upon the application field of the deposition film.

Decomposition energy such as heat, light or discharge is applied to the above substance in the precursor producing spatial region (B) to form a precursor which is then introduced into the film forming spatial region (A). In this case, the life time of the precursor is preferably 0.01 sec or more to enhance the deposition efficiency and deposition rate by improving the efficiency of activation reaction between the active seed introduced from the active seed producing spatial region (C) into the film forming spatial region (A). In this case, as occasions arise, without using discharge energy such as plasma, heat or light energy instead may be applied to the film forming spatial region (A) or to the substrate to form a desired deposition film. As a raw substance for producing an active seed to be introduced in the active seed producing spatial region (C) according to the present invention, such as $H_2$, $SiH_4$, $SiH_3Cl$, $SiH_3Br$, $SiH_3I$, as well as rare gas such as He, Ar may be used.

According to the present invention, the ratio of the quantity of the precursor introduced to the film forming spatial region (A) from the precursor producing spatial region (B) to the quantity of the active seed from the active seed producing spatial region (C) may be determined as desired depending upon the deposition conditions, type of the active seed and the like. The ratio is preferably 10:1 to 1:10 (introduced flow ratio), or more preferably 8:2 to 4:6.

According to the present invention, as the method of producing the precursor and the active seed respectively at the precursor producing spatial region (B) and the active seed producing spatial region (C), excitation energy such as discharge energy, light energy, heat energy or the like energy may be used while taking into account of various conditions and the apparatus to be used.

The photoconductive A-Si(H,X) deposition film formed in the above method is not subjected to film damages to be caused by various ions as in the case of the plasma CVD method, and also to generation of various reaction seeds. Therefore, an A-Si(H,X) deposition film having a large area may be formed with good reproducibility. An A-Si(H,X) photosensor using such an A-Si(H,X) deposition film as a photoconductive layer has excellent characteristics.

As a substrate to be used in the photosensor of the present invention, #7059 and #7740 manufactured by Corning Corp., glass such as SCG manufactued by Tokyo Ohka or quartz glass, ceramic such as partially glazed ceramic may be used.

Next, the method and apparatus of forming an A-Si(H,X) deposition film constituting the photoconductive layer 3 and the ohmic contact layer 4 and the like will be described briefly.

In the following description, an $SiF_2$ radical and an H radical are used respectively for the precursor and the active seed to form an A-Si(H,F) film for the purpose of description simplicity, but any other radical may be used in the similar manner.

Figure 3:
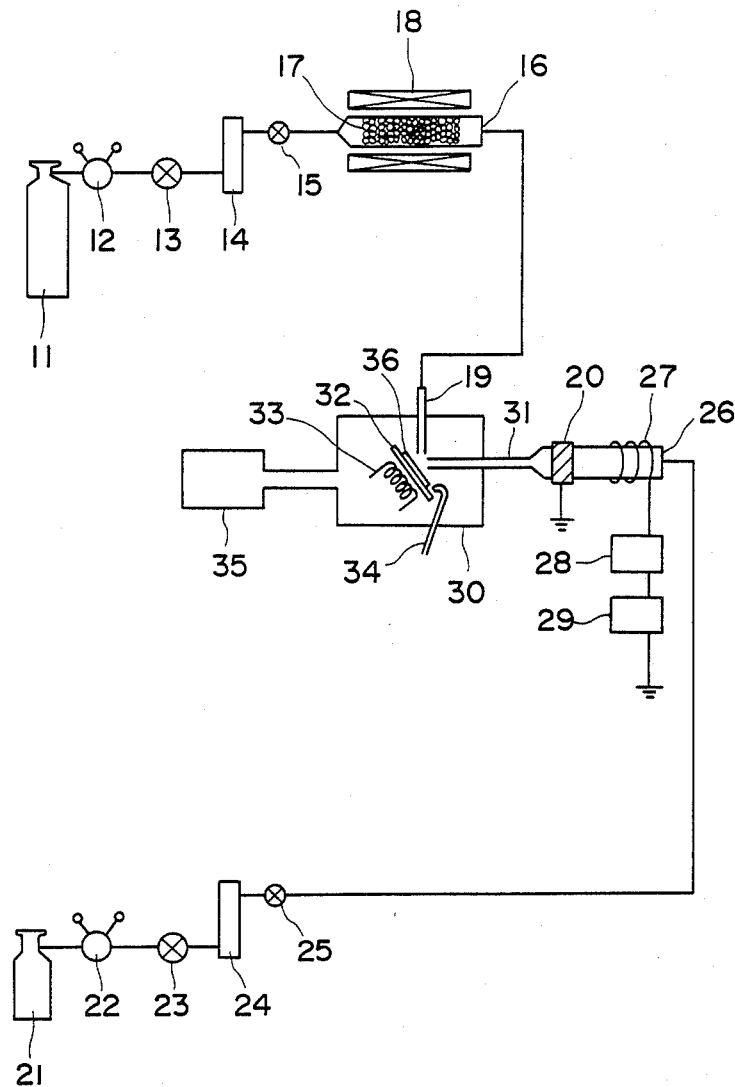
FIGS. 3 and 4 are schematic illustrations of a deposition film producing apparatus.

FIG. 3 is a brief schematic illustration showing an embodiment of the deposition film forming apparatus used in the present invention.

Referring to FIG. 3, an A-Si(H,F) deposition film is formed in a deposition chamber 30 the internal pressure of which can be maintained as desired with an exhaust system 35 constructed of an unrepresented rotary pump, diffusion pump and the like. The pressure at the deposition chamber 30 is preferably 5 mm Torr or less. An $SiF_2$ radical guide pipe 19 and an H radical guide pipe 31 are mounted on the deposition chamber 30. The radicals are introduced from the pipes into the deposition chamber to form an A-Si(H,F) deposition film on a substrate 36 supported by a holder 32.

A substrate heater 33 heats the substrate 36 from the back thereof through the holder 32. On the surface of the holder 32, a thermistor 34 connected to an unrepresented temperature control mechanism is mounted to detect and control the holder temperature. According to the present invention, heating the holder is not necessarily required since the A-Si(H,F) film is formed by introducing the radicals. However, such heating means may be used for the purpose of making the substrate temperature uniform and optimizing the film forming conditions.

A gas bomb 11 contains a raw substance gas such as an $SiF_4$ gas for producing an $SiF_2$ radical. The pressure of the $SiF_4$ gas is adjusted to have a desired one by a gas pressure controller 12. The pressure is preferably in the order of 2 Kg/cm₂. A flow meter 14 and a needle valve 15 adjusts the gas flow. The $SiF_4$ gas subjected to flow adjustment by the flow meter 14 and the needle valve 15 is introduced to a reaction furnace 16 for producing an $SiF_2$ radical. A plurality of raw substance gas supply means constructed of the bomb 11, flow meter 14 and needle valve 15 may be used depending upon the type of gas to be used.

The type of the reaction furnace 16 may be any one of those by which a desired radical such as an $SiF_2$ gas can be produced. Various excitation energy such as discharge energy, heat energy or the like may be used in accordance with an excitation decomposition method for the raw substance gas. However, a method using thermal decomposition is preferable since it can regulate a radical to be produced. For example, to produce an $SiF_2$ radical as in this embodiment, thermal decomposition reactions as in the following may be used.

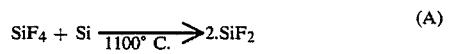   (A)

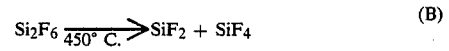   (B)

The reaction furnace 16 of this embodiment is suitable for performing the thermal decomposition reaction shown by the formula (A). The reaction furnace 16 is constructed of a quartz glass tube having an inner diameter of 50 mm and a length of 30 cm, a high impurity silicon crystal 17 of a lump shape being filled within the tube (in this embodiment within the central portion of the tube ranging over 15 cm). The silicon crystal 17 is heated up to about 1100° C., necessary for producing an $SiF_2$ radical, by an infrared ray heater 18. About 60% or more of the $SiF_4$ gas passed through the reaction furnace 16 is converted into an $SiF_2$ radical. The shape of the furnace 16 may take various configurations such as tubular one as above, rectangular cross-sectional one or the like, and the material of the furnace is not specifically limited. In gaseous phase decomposition as in the formula (B), it is satisfactory only if a raw substance gas is passed through a furnace not filled with a solid substance such as the silicon crystal 17.

The SiF$_2$ radical produced in the reaction furnace 16 is introduced into the deposition chamber 30 via the guide pipe 19 which guides the precursor of the present invention. The guide pipe 19 is constructed of a quartz glass tube having an inner diameter of 10 mm for example.

Similar to the raw substance gas for producing the SiF$_2$ radical, a raw substance gas such as an H$_2$ gas for producing an H radical is supplied from a raw substance gas supply system constructed of a gas bomb containing the raw substance gas, bellows valve 23, flow meter 24, needle valve 25 and the like, to a reaction furnace 26. The raw substance gas is adjusted to have a desired pressure and flow by the raw substance gas supply system, the pressure being preferably about 2 Kg/cm$^2$.

Similar to the case of the SiF$_2$ radical, the type of the reaction furnace 26 may take various ones using a decomposition method such as using discharge energy, heat energy or the like. The reaction furnace 26 shown in FIG. 3 is of a discharge type since the raw substance or hydrogen has a high decomposition temperature. In particular, the furnace 26 is constructed of a quartz glass tube having an inner diameter of 50 mm and a length of 30 cm for example. On opposite end portions at the outer surfaces of the furnace 26, there are mounted a coil 27 and a copper plate 20 for generating discharge therebetween (preferably, glow discharge, arc discharge or the like). The coil 27 is wound (three turns in the embodiment of FIG. 3) about the one end portion, the one end of the coil being connected to a high frequency power source 29 through a matching box 28. The copper plate 20 is wound about the other end portion of the furnace 26 remote from the other end of the coil 27 (remote by 5 cm from the coil end in the embodiment of FIG. 3). The copper plate 20 is grounded and, when a high frequency power is applied to the coil 27, a discharge between the coil 27 and the copper plate 20 is generated to decompose the raw substance gas in the furnace 26. In this embodiment, although the discharge is effected from the outside of the furnace, it is also possible to effect it inside of the furnace 26 by mounting the electrodes within the furnace 26.

The H radical produced in the reaction furnace 26 is introduced into the deposition chamber 30 via the guide pipe 31.

The SiF$_2$ radical and the H radical introduced within the deposition chamber 30 are mixed therein and converted into a highly reactive radical such as an SiHF radical. The highly reactive radical is deposited on the substrate 36 supported by the holder 32 in the chamber 30 to form a deposition film comprising A-Si:H or A-Si:H:F. To mix the radicals sufficiently, two radical guide pipes 19 and 31 of the apparatus shown in FIG. 3 are disposed perpendicular to each other facing the film forming surface of the substrate 36. Furthermore, to efficiently use the radicals and form a film, the substrate is disposed having an angle of 45° relative to the radical guide pipes 19 and 31, and positioned as near as possible (for example about 1 cm) at the radical guide pipes 19 and 31.

The SiF$_2$ radical produced by thermal decomposition has a long life time, e.g., about several hundreds sec under the pressure of about 1 mm Torr. Therefore, it is advantageous in transportation or handling, while on the other hand it is difficult to form an A-Si(H,F) film by itself due to its low reactivity. In the present invention, the above-noted highly reactive radical is obtained through conversion by reacting the SiF$_2$ with the H radical, thereby enabling formation of an A-Si(H,F) film. Furthermore, by positively utilizing the long life time of the SiF$_2$, the SiF$_2$ is decomposed outside of the deposition chamber 36 and thereafter introduced near the substrate 36 in the deposition chamber 36, with the guide pipes 19 and 31 disposed as shown in FIG. 3. Thus, the interior of the deposition chamber 36 is not contaminated. In addition, as can be deduced from the long life time of the SiF$_2$, the radical such as an SiHF produced from the SiF$_2$ and the H radical has a long life time as compared with those radicals not including F such as SiH$_2$, thereby enabling a formation of a film such as A-Si:F film or A-Si:H:F film with a higher deposition rate and a higher sensitivity than conventional ones.

The substrate usable in the present invention is not specifically limited, but various materials may be used. Also the shape and dimension of the substrate may be selected as desired depending upon the application and usage of the film.

For instance, the substrate may be of an electrically conductive or insulating nature. A conductive substrate may be made of metal or alloy selected from such as NiCr, stainless, Al, Cr, Mo, Au, Ir, Nb, Ta, V, Ti, Pt and Pd.

An insulated substrate may usually be made of such as film or sheet made of synthetic resin such as polyester, polyethylene, polycarbonate, cellulose acetate, polypropylene, polyvinyl chloride, polystyrene or polyamide, or glass, ceramic or paper. The insulated substrate may preferably have one surface processed as electrically conductive, on the surface of which another layer is formed.

For instance, in case of a glass substrate, one of the surface is processed as electrically conductive by forming a thin film thereon such as NiCr, Al, Cr, Mo, Au, Ir, Nb, Ta, V, Ti, Pt, Pd, In$_2$O$_3$, SnO$_2$, ITO (In$_2$O$_3$+SnO$_2$). Alternatively, in case of a synthetic resin substrate such as a polyester film, the surface is processed as electrically conductive by means of vacuum deposition, electron beam deposition or sputtering, or laminating process using a metal such as NiCr, Al, Ag, Pb, Zn, Ni, Au, Cr, Mo, Ir, Nb, Ta, V, Ti or Pt.

According to the present invention, it is necessary to independently provide on the deposition chamber the guide pipes for introducing the precursor such as an SiF$_2$ radical and the active seed such as an H radical. The material and shape of the guide pipe is not specifically limited, but various materials and shapes are available. The number of respective guide pipes may be plural as occasions demand. The geometrical arrangement of the guide pipes in the deposition chamber is determined so as to ensure a satisfactory mixture of the precursor and the active seed, e.g., it is preferable to dispose them perpendicular to each other as described above.

According to the present invention, by moving at a constant speed the substrate mounted on the holder within the deposition chamber, it is possible to uniformly form an A-Si(H,F) film of a large area on a large substrate.

The invention will further be described in detail with reference to the preferred embodiments.

EXAMPLE 1

A glass substrate (#7059 manufactured by Corning Corp.) with both surfaces abrased was fully washed using neutral detergent and mounted on the holder 32 of the apparatus having the similar construction as shown in FIG. 3.

The deposition chamber 30 was evacuated up to $1 \times 10^{-6}$ Torr and the temperature of the substrate 36 was maintained at 230° C. Next, a raw substance gas for producing a halogen radical using a high purity $SiF_4$ gas was flowed at a flow rate of 50 sccm into the reaction furnace 16 maintained at a temperature of 1100° C. and decomposed and thereafter, the decomposed gas was introduced into the deposition chamber 30 via the guide pipe 19. At the same time, an $H_2$ gas was flowed at a flow rate of 150 sccm into the reaction furnace 26 and decomposed by means of a glow discharge generated between the coil 27 and the copper plate 20 by applying a high frequency power of 50 W and 13.56 MHz. Thereafter, the decomposed gas was introduced into the deposition chamber 30 via the guide pipe 31.

Figure 4:
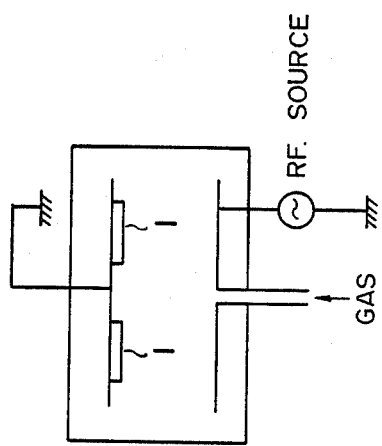

The above state was maintained for 20 minutes to form an A-Si(H,F):F film of 9000 Å in thickness on the substrate 36. Succeedingly, the substrate 36 formed with the A-Si(H,F):F film was placed on a predetermined position in a usual plasma CVD apparatus as shown in FIG. 4 and thereafter, the internal pressure of the apparatus was reduced to $1 \times 10^{-5}$ Torr.

Next, a mixture gas made of $SiH_4$ diluted at 10% with $H_2$ (hereinafter referred to as $SiH_4$ (10)/$H_2$) and $pH_3$ diluted at 100 ppm with $H_2$ (hereinafter referred to as $pH_3$ (100)/$H_2$), at a mixture ratio of 1:10, was introduced in the apparatus to deposit an $n^+$ type A-Si:H layer (about 1500 Å in thickness) serving as an ohmic contact layer on the A-Si(H,F):H film at the discharge power of 30 W. Next, aluminum was deposited to form an aluminum conductive layer of 3000 Å in thickness on the $n^+$ layer by means of an electron beam deposition method.

Next, a photoresist pattern of a desired shape was formed by using a positive type photoresist (AZ-1370 manufactured by Sipley Corp.) and thereafter, a solution (hereinafter referred to as etching solution 1), made of a mixture of phosphoric acid (aqueous solution of 85% in volume), nitric acid (aqueous solution of 60% in volume), glacial acetic acid, and water at the volume ratio of 16:1:2:1, was used for etching the exposed conductive layer. Next, the exposed $n^+$ type A-Si:H layer was removed by dry-etching using a $CF_4$ gas by means of a plasma etching method using a parallel plate type apparatus under the conditions of RF discharge power of 120 W and gas pressure of 0.07 Torr. Next, the photoresist was removed.

Thus, an A-Si (H,X):H photosensor sample (A) having the structure as shown in FIGS. 1 and 2 was manufactured. The gap of the light reception area formed by the electrodes 5 was 10 μm.

COMPARATIVE EXAMPLE

A similar substrate to that used in Example 1 was placed in a usual plasma CVD apparatus as shown in FIG. 4. After maintaining the substrate temperature at 230° C. and evacuating the apparatus up to $1 \times 10^{-6}$ Torr, an epitaxial grade, pure $SiH_4$ gas(manufactured by Komatsu Densi) was flowed into the apparatus at a flow rate of 50 sccm with the gas pressure set at 0.07 Torr. Thereafter, a glow discharge was effected for 5 hours under the conditions of RF power of 8 W at frequency of 13.56 MHz and input voltage of 0.3 KV to form an A-Si:H film having a thickness of about 9000 Å on the substrate.

Succeedingly, by way of the same processes as of Example 1, an $n^+$ type A-Si:H layer and an aluminum layer were formed to manufacture by the same photolithographic etching process an A-Si:H photosensor sample (B).

Figure 5:
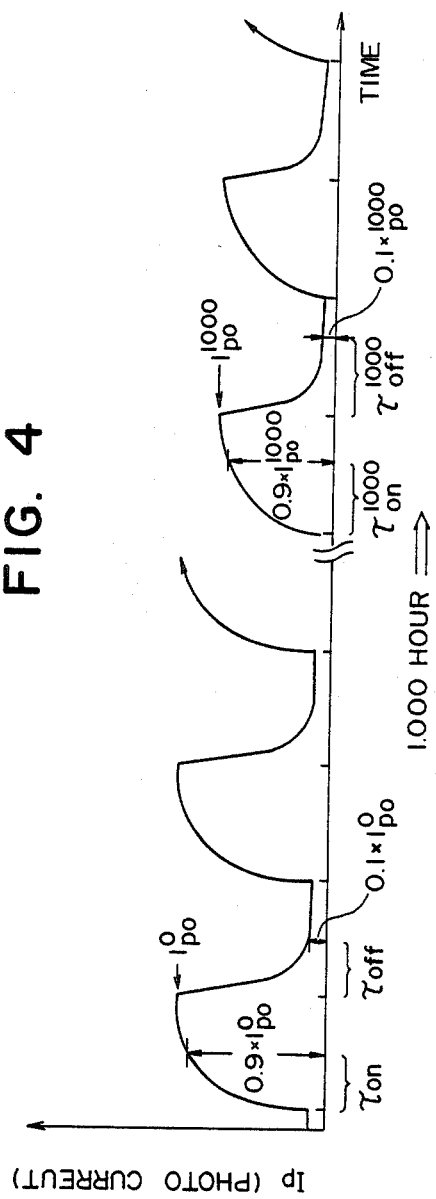
FIG. 5 is a photocurrent Ip waveform representation.

A monochrome light (LED light) of 567 nm at 1000 lx was applied, while turning on and off at a frequency of 50 Hz, to the photosensor samples (A) and (B) manufactured as above, under application of voltage of 10 V between each pair of electrodes. The response of photocurrent was measured as shown in FIG. 5.

The measured values were photocurrent Ipo (nA) after 5 msec from light application, time $\tau$on (msec) to reach 90% of Ipo, and time $\tau$off (msec) to attenuate to 10% of Ipo after the light was turned off. The similar measurements were conducted after 1000 hours from the time when the photosensor samples (A) and (B) were undergone the above operations, to thereby obtaining $I_{(po}{}^{1000})$, $\tau_{(on}{}^{1000})$ and $\tau_{(off}{}^{1000})$. These measured values were compared.

TABLE 1

| ITEM | SAMPLE (A) | SAMPLE (B) |
|---|---|---|
| $I_{(po}{}^{0})$ | 105 | 90 |
| $\tau$(on) | 2.5 | 2.5 |
| $\tau$(off) | 2.0 | 4.0 |
| $I_{(po}{}^{1000})$ | 95 | 65 |
| $\tau_{(on}{}^{1000})$ | 2.0 | 2.5 |
| $\tau_{(off}{}^{1000})$ | 2.0 | 5.0 |

As shown in Table 1, the photosensor sample (A) manufactured as with Example 1 has the following remarkable improvements as compared with the photosensor sample (B) manufactured as with Comparative Example.

(1) The output photocurrent is large, and the response to light, particularly the response after light was turned off, is good.

(2) The change in output photocurrent after 1000 operation hours is maintained 90% or more, according a remarkable improvement as compared with about 70% of the conventional one.

(3) The degradation of the performance after 1000 operation hours after light was turned does not occur, while it occurs in the case of a conventional one.

EXAMPLE 2

Similar to Example 1, a glass substrate of 20×250 mm×1.0 t made of #7059 manufactured by Corning Corp. was placed on the holder 32 of the apparatus as shown in FIG. 3. The holder 32 was moved, while forming a film, at a slow constant speed (40 mm/hs) in the direction of an elongated side (250 mm) of the substrate to form a uniform A-Si (H,F):H film of 220 nm length and about 0.8 μm in thickness. Succeedingly, with a similar method to that of Example 1, a mask having a predetermined pattern was used at the photolithographic etching process to thereby manufacture 1728 photosensors disposed in an array on the substrate.

Figure 6:
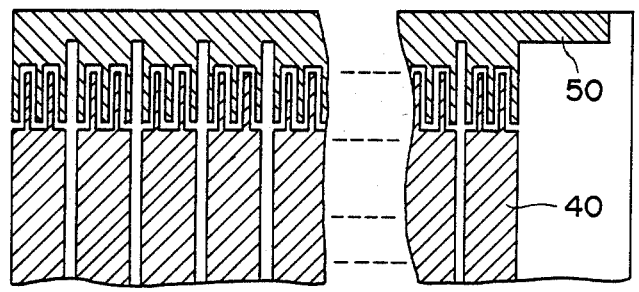
FIG. 6 is a schematic and partial plan view of a photosensor array.

The elongated photosensor array manufactured as above is shown in FIG. 6 as a brief, partial, and cross-sectional plan view. In the figure, reference numeral 40 designates a separate electrode, and reference numeral 50 designates a common electrode. The density of the elongated photosensor array was 8 bits/mm and has a length corresponding to A4 size.

Figure 7:
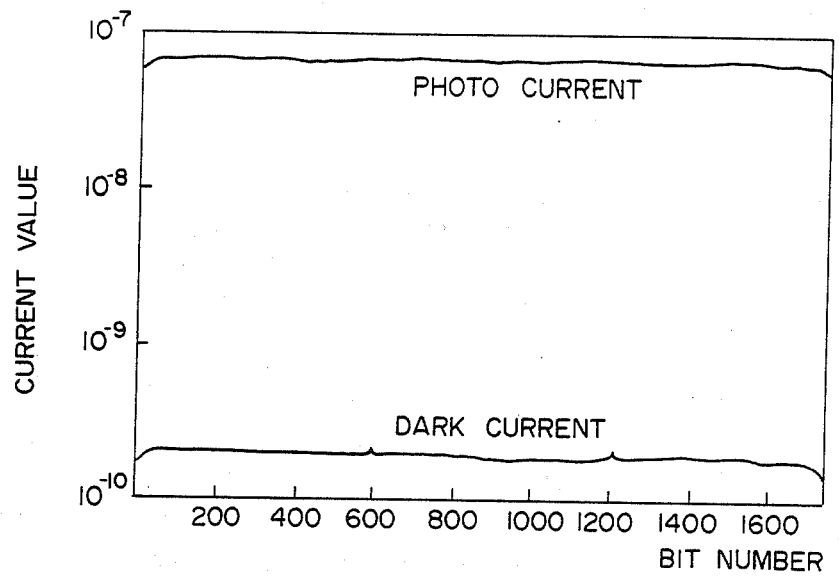
FIGS. 7 and 8 are graphs showing examples of measured current values at respective bits of an elongated linear photosensor array.

The uniformity of photocurrents and dark currents between the bits of the photosensor array of Example 2 was measured, the result of which is shown in FIG. 7.

Figure 8:
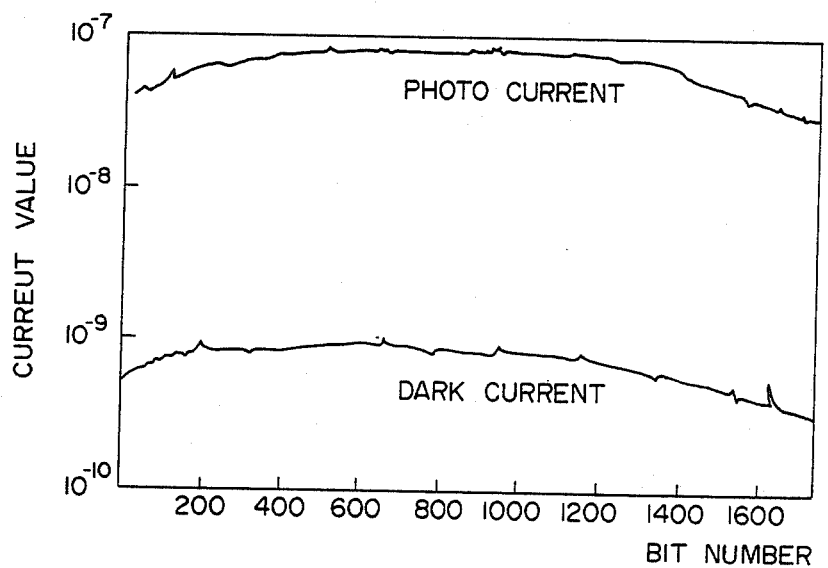

For comparison sake, the uniformity of photocurrents and dark currents between the bits of a photosensor array having 1,728 photosensors on the substrate and manufactured in accordance with the method described in Comparative Example 1, was measured, the result of which is shown in FIG. 8.

It can be understood from a comparison between FIGS. 7 and 8 that the photosensor according to the present invention has an excellent uniformity in its photoconductive property.

EXAMPLE 3

The elongated photosensor array having 1,728 bits as manufactured in Example 2 was matrix-driven by dividing it into 54 blocks each having 32 bits.

In particular, after manufacturing an elongated photosensor array by employing similar processes to those in Example 2, polyimide resin (manufactured by Hitachi Kasei under trade name PIQ) was coated on the entire surface of the photosensor array and was baked. Thereafter, a mask of a desired pattern made of a negative type photoresist (OMR-83 manufactured by Tokyo Ohka) was used to remove the unnecessary portions of the PIQ layer using a polyimide resin etching solution (PIQ etchant manufactured by Hitachi Kasei). After removing the photoresist film OMR-83, the PIQ film was cured for 1 hour at 300° C. under a nitrogen atmosphere, and an insulation layer and through-holes were formed for matrix-interconnection.

Figure 9:
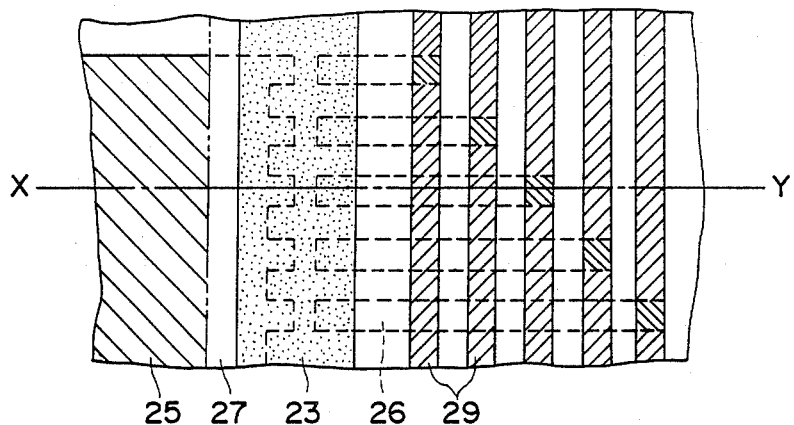
FIG. 9 is a schematic and partial plan view briefly showing matrix interconnection area of the photosensor array of the present invention.
Figure 10:
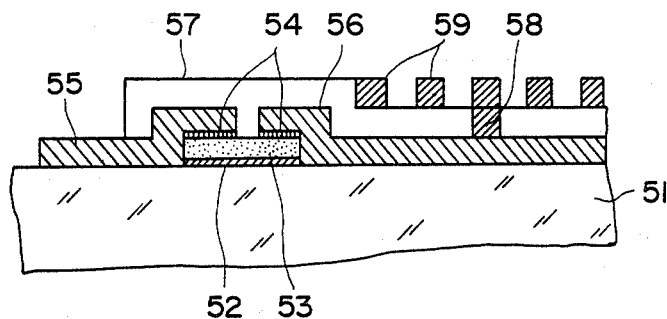
FIG. 10 is a partial cross-section along line X-Y of FIG. 9.

The brief, partial, and cross-sectional plan view of the matrix-interconnection section of the elongated photosensor array, fabricated as above, is shown in FIG. 9, the cross-section along X-Y line thereof being shown in FIG. 10. In FIGS. 9 and 10, the photosensor array is constructed of a substrate 51, an SiO₂ base layer 52, an n+ type A-Si:H layer 54, a common electrode 55, a separate electrode 56, an insulation layer 57, a through-hole 58 and an upper electrode 59 of a matrix interconnection.

Figure 11:
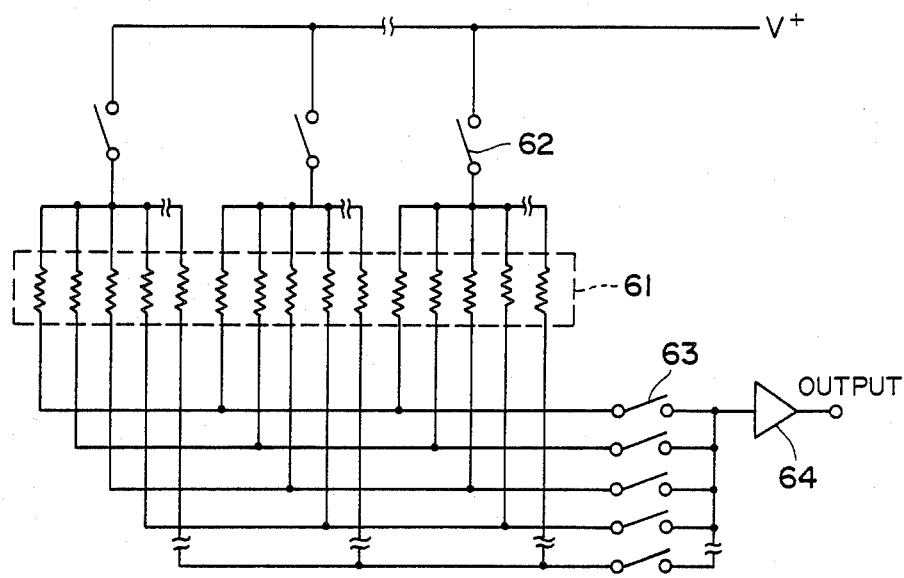
FIG. 11 is a driving circuit digram.

A driving circuit is shown in FIG. 11 which matrix-drives the elongated photosensor array manufactured as above and having the density of 8 bits/mm and a length corresponding to A4 size. In FIG. 11, reference numeral 61 represents a photoconductive layer of the photosensor, 62 a block selection switch, 63 a common switch and 64 an amplifier.

Figure 12:
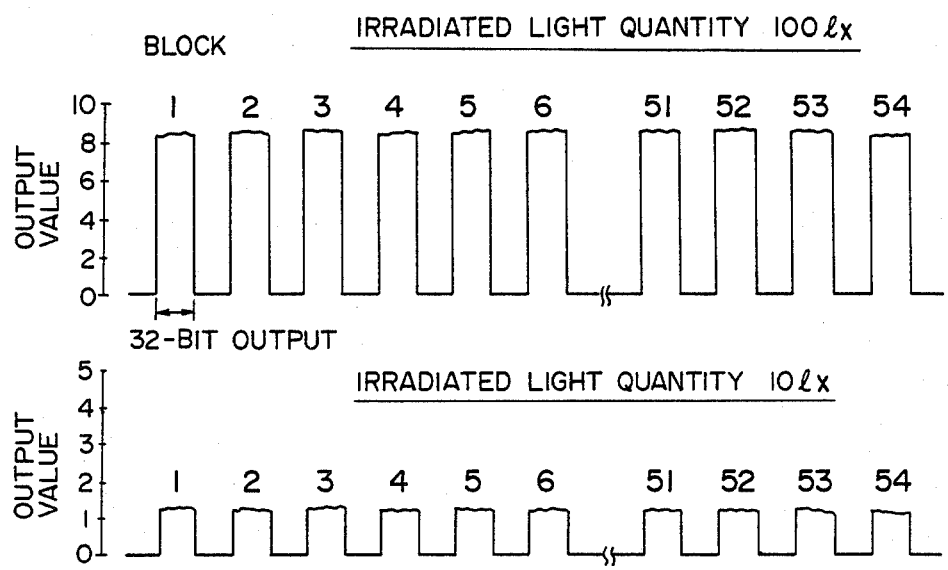
FIG. 12 are graphs showing output values relative to irradiated light quantity.

The uniformity of outputs between the bits of the elongated array was measured 100 μsec after an voltage was applied during matrix-driving, the result of which is shown in FIG. 12. As seen from FIG. 12, an excellent uniformity between respective bits and an S/N ratio of each bit were observed, which satisfactorily enables a signal readout under matrix-driving.

According to the above Examples, the electrical, optical, photoconductive and mechanical characteristics are improved, thus realizing a photosensor having a high-sensitivity and an excellent S/N ratio. Reproducibility, quality and uniformity of a film is improved. Further, a film of a large area can be efficiently manufactured, and an improvement on productivity and mass production of a film can readily be realized.

Furthermore, it is possible to form a film at a low temperature so that even a substrate having a low temperature resistance can be used to deposit a film thereon, which results in an advantage that the processes can be simplified because of its low temperature processing.

What is claimed is:

1. A method of manufacturing a photosensor having a substrate, a photoconductive layer formed on said substrate and containing amorphous silicon, a pair of electrodes electrically connected to said photoconductive layer and a light receiving section having a predetermined area for applying light to said photoconductive layer, wherein said photoconductive layer is formed by producing a precursor (SiX) including at least silicon atoms and halogen atoms and an active seed (H) including hydrogen atoms, at the region outside of a layer forming spatial region where said photoconductive layer is formed, and next by introducing said precursor and said active seed into said layer forming spatial region.

2. A manufacturing method according to claim 1, wherein said precursor (Si,X) is produced by applying excitation energy to at least one compound selected from the compounds shown by the following general formulas (1) to (4):

$$Si_nX_{2n+2} \qquad (1)$$

$$(SiX_2)_m \qquad (2)$$

$$Si_nHX_{2n+1} \qquad (3)$$

$$Si_nH_2X_{2n} \qquad (4)$$

wherein n is a positive integer, m is a positive integer of 3 or greater, and X is a halogen atom.

3. A manufacturing method according to claim 1, wherein said active seed is produced by applying excitation energy to at least one selected from H₂, SiH₄, SiH₃F, SiH₃Cl, SiH₃Br, SiH₃I, He and Ar.

4. A manufacturing method according to claim 1, wherein the ratio of said precursor to said active seed to be introduced into said layer forming spatial region is 10:1 to 1:10 in terms of flow.

* * * * *

UNITED STATES PATENT AND TRADEMARK OFFICE
CERTIFICATE OF CORRECTION

PATENT NO. : 4,743,750

DATED : May 10, 1988

INVENTOR(S) : TOSHIYUKI KOMATSU, ET AL.

It is certified that error appears in the above-identified patent and that said Letters Patent is hereby corrected as shown below:

IN THE DRAWINGS

Sheet 5, Figure 8, "CURREUT VALUE" should read --CURRENT VALUE--.

COLUMN 1

Line 51, "closely" should read --is closely--.

COLUMN 2

Line 27, "on" should read --in--.
Line 34, "life time" should read --lifetime--.
Line 41, "CvD" should read --CVD--.

COLUMN 3

Line 6, "of FIG. 2;" should read --of FIG. 1;--.
Line 59, "a similar" should read --similar reactants--.

COLUMN 4

Line 8, "life time" should read --lifetime--.
Line 13, "life time" should read --lifetime--.
Line 16, "life" should read --life---.
Line 41, "enabling" should read --permitting--.
Line 45, "influences of" should read --influences of such factors--.

UNITED STATES PATENT AND TRADEMARK OFFICE
CERTIFICATE OF CORRECTION

PATENT NO. : 4,743,750

DATED : May 10, 1988

INVENTOR(S) : TOSHIYUKI KOMATSU, ET AL.

It is certified that error appears in the above-identified patent and that said Letters Patent is hereby corrected as shown below:

COLUMN 5

Line 2, "$Si n X_{2n+2}$" should read --$Si_n X_{2n+2}$--.
Line 4, "$Si n H X_{2n+1}$" should read --$Si_n H X_{2n+1}$--.
Line 4, "$Si n H_2 X_{2n}$" should read --$Si_n H_2 X_{2n}$--.
Line 16, "life time" should read --lifetime--.
Line 26, "substrance" should read --substance--.

COLUMN 6

Line 32, "2 Kg/cm$_2$." should read --2 Kg/cm$^2$.--.

COLUMN 8

Line 2, "life time" should read --lifetime--.
Line 10, "life" should read --life---.
Line 12, "deposition chamber 36" should read --deposition chamber 30--.
Line 13, "deposition chamber 36" should read --deposition chamber 30--.
Line 15, "deposition chamber 36" should read --deposition chamber 30--.
Line 17, "life time" should read --lifetime--.
Line 18, "life" should read --life---.
Line 32, "stainless," should read --stainless steel,--.
Line 43, "surface" should read --surfaces--.

UNITED STATES PATENT AND TRADEMARK OFFICE
CERTIFICATE OF CORRECTION

PATENT NO. : 4,743,750

DATED : May 10, 1988

INVENTOR(S) : TOSHIYUKI KOMATSU, ET AL.

It is certified that error appears in the above-identified patent and that said Letters Patent is hereby corrected as shown below:

COLUMN 9

Line 35, "pH$_3$" should read --PH$_3$--.
    Line 37, "pH$_3$ (100)/H$_2$," should read
        --PH$_3$ (100)/H$_2$,--.

COLUMN 10

Line 1, "gas(manufactured" should read
        --gas (manufactured--.
    Line 26, "were undergone" should read --underwent--.
    Line 26, "to" should be deleted.
    Line 53, "turned" should read --turned off--.
    Line 68, "1728" should read --1,728--.

COLUMN 11

Line 58, "an" should read --a--.

UNITED STATES PATENT AND TRADEMARK OFFICE
CERTIFICATE OF CORRECTION

PATENT NO. : 4,743,750

DATED : May 10, 1988

INVENTOR(S) : TOSHIYUKI KOMATSU, ET AL.

It is certified that error appears in the above-identified patent and that said Letters Patent is hereby corrected as shown below:

COLUMN 12

Lines 41-47,
"$Si n X_{2n+2}$ (1)" should read --$Si_n X_{2n+2}$ (1)--.
$(SiX_2)_m$ (2) $(SiX_2)_m$ (2)
$Si_n H X_{2n+1}$ (3) $Si_n H X_{2n+1}$ (3)
$Si_n H_2 X_{2n}$ (4) $Si_n H_2 X_{2n}$ (4)

Signed and Sealed this

Twenty-fifth Day of April, 1989

Attest:

DONALD J. QUIGG

Attesting Officer

Commissioner of Patents and Trademarks